(12) United States Patent
Yamane et al.

(10) Patent No.: US 9,515,254 B2
(45) Date of Patent: Dec. 6, 2016

(54) STORAGE ELEMENT, MEMORY AND ELECTRONIC APPARATUS

(71) Applicant: Sony Corporation, Tokyo (JP)

(72) Inventors: Kazutaka Yamane, Kanagawa (JP); Masanori Hosomi, Tokyo (JP); Hiroyuki Ohmori, Kanagawa (JP); Kazuhiro Bessho, Kanagawa (JP); Yutaka Higo, Kanagawa (JP); Hiroyuki Uchida, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/086,568

(22) Filed: Mar. 31, 2016

(65) Prior Publication Data

US 2016/0218279 A1  Jul. 28, 2016

Related U.S. Application Data

(63) Continuation of application No. 14/943,781, filed on Nov. 17, 2015, now Pat. No. 9,324,940, which is a continuation of application No. 14/055,386, filed on Oct. 16, 2013, now Pat. No. 9,224,942, which is a continuation of application No. 13/226,983, filed on Sep. 7, 2011, now Pat. No. 8,611,139.

(30) Foreign Application Priority Data

Sep. 14, 2010 (JP) ................. 2010-205262

(51) Int. Cl.
*G11C 11/00* (2006.01)
*G11C 11/15* (2006.01)
*H01L 43/10* (2006.01)
*H01L 43/08* (2006.01)

(52) U.S. Cl.
CPC ............. *H01L 43/10* (2013.01); *H01L 43/08* (2013.01)

(58) Field of Classification Search
CPC .................. G11C 11/00; G11C 11/15
USPC ....... 365/48, 55, 62, 66, 74, 78, 80–93, 100, 365/130, 131, 148, 158, 171–173, 209, 213, 365/225.5, 230.07, 232, 243.5; 977/933–935; 257/421, E21.665; 428/810–816, 817–825.1, 826
See application file for complete search history.

(56) References Cited

U.S. PATENT DOCUMENTS 6,256,223 B1   7/2001  Sun
6,845,038 B1 * 1/2005  Shukh .................... G11C 11/14
                                                                       365/164

(Continued)

FOREIGN PATENT DOCUMENTS

CN     101743634    6/2010
JP     2003-17782    1/2003

(Continued)

OTHER PUBLICATIONS

Notification of the First Office Action issued in connection with Chinese Patent Application No. 2011102638009, dated May 7, 2015. (27 pages).

(Continued)

*Primary Examiner* — Harry W Byrne
(74) *Attorney, Agent, or Firm* — K&L Gates LLP

(57) ABSTRACT

A storage element is provided. The storage element includes a memory layer having a first magnetization state of a first material; a fixed magnetization layer having a second magnetization state of a second material; an intermediate layer including a nonmagnetic material and provided between the memory layer and the fixed magnetization layer; wherein the first material includes Co—Fe—B alloy, and at least one of a non-magnetic metal and an oxide.

18 Claims, 9 Drawing Sheets

(56) References Cited

U.S. PATENT DOCUMENTS

| | | | |
|---|---|---|---|
| 7,242,045 B2 | 7/2007 | Nguyen et al. | |
| 7,660,153 B2 | 2/2010 | Yamane | |
| 2002/0163766 A1* | 11/2002 | Eguchi | B82Y 10/00 360/324.12 |
| 2004/0080876 A1* | 4/2004 | Sugita | B82Y 10/00 360/324.2 |
| 2004/0188733 A1* | 9/2004 | Asao | B82Y 10/00 257/295 |
| 2005/0036361 A1* | 2/2005 | Fukuzumi | H01L 27/228 365/158 |
| 2006/0018057 A1* | 1/2006 | Huai | G01R 33/06 360/324.2 |
| 2006/0044703 A1* | 3/2006 | Inomata | B82Y 10/00 360/324.1 |
| 2009/0015958 A1* | 1/2009 | Nakamura | G11B 5/66 360/55 |
| 2010/0072524 A1* | 3/2010 | Huai | B82Y 10/00 257/295 |
| 2012/0320666 A1 | 12/2012 | Ohno et al. | |

FOREIGN PATENT DOCUMENTS

| | | |
|---|---|---|
| JP | 2008-160031 | 7/2008 |
| JP | 2008-227388 | 9/2008 |
| JP | 2008-252036 | 10/2008 |
| JP | 2008-252037 | 10/2008 |
| JP | 2010-016408 | 1/2010 |
| WO | 2011-111473 | 9/2011 |

OTHER PUBLICATIONS

Reasons for refusal notice issued in connection with Japanese Patent Application No. 2010-205262, dated Jan. 6, 2015. (3 pages).

L. Berger, "Emission of spin waves by a magnetic multilayer traversed by a current", Physical Review B, vol. 54, No. 13, 1996.

J.C. Slonczewski, "Current-driven excitation of magnetic multilayers", Journal of Magnetism and Magnetic Material, 159, L 1-L7, 1996.

Albert, et al., "Spin-polarized current switching of a Co thin film nanomagnet", Applied Physics Letters, vol. 77, No. 23, 2000.

* cited by examiner

STORAGE ELEMENT, MEMORY AND ELECTRONIC APPARATUS

CROSS REFERENCES TO RELATED APPLICATIONS

The present application is a Continuation of U.S. application Ser. No. 14/943,781, filed on Nov. 17, 2015, which is a Continuation of U.S. application Ser. No. 14/055,386, filed on Oct. 16, 2013, now U.S. Pat. No. 9,224,942, issued Dec. 29, 2015, which is a Continuation of U.S. application Ser. No. 13/226,983, filed on Sep. 7, 2011, now U.S. Pat. No. 8,611,139, issued Dec. 17, 2013, which claims priority to Japanese Priority Patent Application JP 2010-205262 filed in the Japan Patent Office on Sep. 14, 2010, the entire contents of which are hereby incorporated by reference.

BACKGROUND

The present disclosure relates to a memory element that includes a memory layer that stores the magnetization state of a ferromagnetic layer as information and a magnetization-fixed layer in which a magnetization direction is fixed, and that changes the magnetization direction of the memory layer by flowing a current, and a memory device having the memory element.

In an information device such as a computer, a highly dense DRAM that operates at a high speed has been widely used as a random access memory.

However, the DRAM is a volatile memory in which information is erased when power is turned off, such that a non-volatile memory in which the information is not erased is desirable.

In addition, as a candidate for the non-volatile memory, a magnetic random access memory (MRAM) in which the information is recorded by magnetization of a magnetic material has attracted attention and therefore has been developed.

The MRAM makes a current flow to two kinds of address interconnects (a word line and a bit line) that are substantially perpendicular to each other, respectively, and inverts the magnetization of a magnetic layer of a magnetic memory element, which is located at an intersection of the address interconnects, of the memory device by using a current magnetic field generated from each of the address interconnects, and thereby performs the recording of information.

A schematic diagram (perspective view) of a general MRAM is shown in FIG. 7.

A drain region 108, a source region 107, and a gate electrode 101, which make up a selection transistor that selects each memory cell, are formed at portions separated by an element separation layer 102 of a semiconductor substrate 110 such as a silicon substrate, respectively.

In addition, a word line 105 extending in the front-back direction in the drawing are provided at an upper side of the gate electrode 101.

The drain region 108 is formed commonly to left and right selection transistors in the drawing, and an interconnect 109 is connected to the drain region 108.

In addition, magnetic memory elements 103, each having a memory layer whose magnetization direction is inverted, are disposed between the word line 105 and bit lines 106 that are disposed at an upper side in relation to the word line 105 and extend in the left-right direction in the drawing. These magnetic memory elements 103 are configured, for example, by a magnetic tunnel junction element (MTJ element).

In addition, the magnetic memory elements 103 are electrically connected to the source region 107 through a horizontal bypass line 111 and a vertical contact layer 104.

When a current is made to flow to the word line 105 and the bit lines 106, a current magnetic field is applied to the magnetic memory element 103 and thereby the magnetization direction of the memory layer of the magnetic memory element 103 is inverted, and therefore it is possible to perform the recording of information.

In addition, in regard to a magnetic memory such as the MRAM, it is necessary for the magnetic layer (memory layer) in which the information is recorded to have a constant coercive force in order to stably retain the recorded information.

On the other hand, it is necessary to make a certain amount of current flow to the address interconnect to order to rewrite the recorded information.

However, along with miniaturization of the element making up the MRAM, the address interconnect becomes thin, such that it is difficult to flow a sufficient current.

Therefore, as a configuration capable of realizing the magnetization inversion with a relatively small current, a memory having a configuration using a magnetization inversion by spin injection has attracted attention (for example, refer to Japanese Unexamined Patent Application Publication Nos. 2003-17782 and 2008-227388, and a specification of U.S. Pat. No. 6,256,223, PHYs. Rev. B, 54.9353 (1996), and J. Magn. Mat., 159, L1 (1996).

Magnetization inversion by the spin injection means that a spin polarized electron after passing through a magnetic material is injected to the other magnetic material, and thereby magnetization inversion is caused in the other magnetic material.

For example, when a current is made to flow to a giant magnetoresistive effect element (GMR element) or a magnetic tunnel junction element (MTJ element) in a direction perpendicular to a film face, the magnetization direction of at least a part of the magnetic layer of this element may be inverted.

In addition, magnetization inversion by spin injection has an advantage in that even when the element becomes minute, it is possible realize the magnetization inversion without increasing the current.

A schematic diagram of the memory device having a configuration using magnetization inversion by the above-described spin injection is shown in FIGS. 8 and 9. FIG. 8 shows a perspective view, and FIG. 9 shows a cross-sectional view.

A drain region 58, a source region 57, and a gate electrode 51 that make up a selection transistor for the selection of each memory cell are formed, respectively, in a semiconductor substrate 60 such as a silicon substrate at portions isolated by an element isolation layer 52. Among them, the gate electrode 51 also functions as a word line extending in the front-back direction in FIG. 8.

The drain region 58 is formed commonly to left and right selection transistors in FIG. 8, and an interconnect 59 is connected to the drain region 58.

A memory element 53 having a memory layer in which a magnetization direction is inverted by spin injection is disposed between the source region 57 and bit lines 56 that are disposed in an upper side of the source region 57 and extend in the left-right direction in FIG. 8.

This memory element 53 is configured by, for example, a magnetic tunnel junction element (MTJ element). The memory element 53 has two magnetic layers 61 and 62. In the two magnetic layers 61 and 62, one side magnetic layer is set as a magnetization-fixed layer in which the magnetization direction is fixed, and the other side magnetic layer is set as a magnetization-free layer in which that magnetization direction varies, that is, a memory layer.

In addition, the memory element 53 is connected to each bit line 56 and the source region 57 through the upper and lower contact layers 54, respectively. In this manner, when a current is made to flow to the memory element 53, the magnetization direction of the memory layer may be inverted by spin injection.

In the case of the memory device having a configuration using magnetic inversion by this spin injection, it is possible to make the structure of the device simple compared to the general MRAM shown in FIG. 7, and therefore it has a characteristic in that high densification is realized.

In addition, when magnetization inversion by the spin injection is used, there is an advantage in that even as miniaturization of the element proceeds, the write current is not increased, compared to the general MRAM performing magnetization inversion by an external magnetic field.

SUMMARY

However, in the case of the MRAM, a write interconnect (word line or bit line) is provided separately from the memory element, and the writing of information (recording) is performed using a current magnetic field generated by flowing a current to the write interconnect. Therefore, it is possible to make a sufficient amount of current necessary for the writing flow to the write interconnect.

On the other hand, in the memory device having a configuration using magnetization inversion by spin injection, it is necessary to invert the magnetization direction of the memory layer by performing spin injection using a current flowing to the memory element.

Since the writing (recording) of information is performed by directly flowing a current to the memory element as described above, a memory cell is configured by connecting the memory element to a selection transistor to select a memory cell that performs the writing. In this case, the current flowing to the memory element is restricted to a current magnitude capable of flowing to the selection transistor (a saturation current of the selection transistor).

Therefore, it is necessary to perform writing with a current equal to or less than the saturation current of the selection transistor, and therefore it is necessary to diminish the current flowing to the memory element by improving spin injection efficiency.

In addition, to increase the read-out signal strength, it is necessary to secure a large magnetoresistance change ratio, and to realize this, it is effective to adopt a configuration where an intermediate layer that comes into contact with both sides of the memory layer is set as a tunnel insulation layer (tunnel barrier layer).

In this way, in a case where the tunnel insulation layer is used as the intermediate layer, the amount of current flowing to the memory element is restricted to prevent the insulation breakdown of the tunnel insulation layer. From this viewpoint, it is also necessary to restrict the current at the time of spin injection.

Since such a current value is proportional to a film thickness of the memory layer and is proportional to the square of the saturation magnetization of the memory layer, it may be effective to adjust these (film thickness and saturated magnetization) to decrease such a current value (for example, refer to F. J. Albert et al., Appl. Phy. Lett., 77, 3809 (2000).

For example, in F. J. Albert et al., Appl. Phy. Lett., 77, 3809 (2000), the fact that when the amount of magnetization (Ms) of the recording material is decreased, the current value may be diminished is disclosed.

However, on the other hand, if the information written by the current is not stored, a non-volatile memory is not realized. That is, it is necessary to secure a stability (thermal stability) against the thermal fluctuation of the memory layer.

In the case of the memory element using magnetization inversion by spin injection, since the volume of the memory layer becomes small, simply considered the thermal stability tends to decrease, compared to the MRAM in the related art.

When thermal stability of the memory layer is not secured, the inverted magnetization direction re-inverts by heating, and this leads to writing error.

In addition, in a case where high capacity of the memory element using magnetization inversion by the spin injection is advanced, the volume of the memory element becomes smaller, such that the securing of the thermal stability becomes an important problem.

Therefore, in regard to the memory element using the magnetization inversion by spin injection, thermal stability is a very important characteristic.

Therefore, to realize a memory element having a configuration where the magnetization direction of the memory layer as a memory is inverted by spin injection, it is necessary to diminish the current necessary for the magnetization inversion by spin injection to a value equal to or less than the saturation current of the transistor, and thereby securing thermal stability for retaining written information reliably.

As described above, to diminish the current necessary for the magnetization inversion by spin injection, diminishing the saturated magnetization amount Ms of the memory layer, or making the memory layer thin may be considered. For example, as is the case with U.S. Pat. No. 7,242,045, it is effective to use a material having a small saturated magnetization amount Ms as the material for the memory layer. However, in this way, in a case where the material having the small saturated magnetization amount Ms is simply used, it is difficult to secure thermal stability for reliably retaining information.

Therefore, in this disclosure, it is desirable to provide a memory element capable of improving thermal stability without increasing the write current, and a memory device with the memory element.

According to an example embodiment, there is provided a memory element including a layered structure. The layered structure includes a memory layer that has a magnetization perpendicular to a film face and of which a magnetization direction varies corresponding to information, a magnetization-fixed layer that has a magnetization that is perpendicular to the film face and becomes a reference for the information stored in the memory layer, and an insulating layer that is provided between the memory layer and the magnetization-fixed layer and is formed of a non-magnetic material. An electron that is spin-polarized is injected in a lamination direction of the layered structure and thereby the magnetization direction of the memory layer varies and a recording of information is performed with respect to the memory layer, a magnitude of an effective diamagnetic field which the memory layer receives is smaller than a saturated magnetization amount of the memory layer. In regard to the insulating layer that comes into contact with the memory layer, and the other side layer with which the memory layer comes into contact at a side opposite to the insulating layer, at least an interface that comes into contact with the memory layer is formed of an oxide film, and the memory layer includes at least one of non-magnetic metal and oxide in addition to a Co—Fe—B magnetic layer.

In addition, in regard to the insulating layer and the other side layer, at least a layer of an interface that comes into contact with the memory layer may be formed of an MgO film.

In addition, the non-magnetic metal included in the memory layer may be any one of Ti, V, Nb, Zr, Ta, Hf, and Y.

In addition, the oxide included in the memory layer may be any one of MgO, $SiO_2$, and Al—O.

In addition, the layered structure may includes a cap layer provided as the other side layer that comes into contact with the memory layer, that is, the layered structure may be a single structure.

In addition, the layered structure may includes a second insulating layer provided as the other side layer that comes into contact with the memory layer, and a second magnetization-fixed layer may be provided through the second insulating layer, that is, the layered structure may be a dual structure.

In addition, according to another, there is provided a memory element including a layered structure. The layered structure includes a memory layer that has a magnetization perpendicular to a film face and of which a magnetization direction varies corresponding to information, a magnetization-fixed layer that has a magnetization that is perpendicular to the film face and becomes a reference for the information stored in the memory layer, and an insulating layer that is provided between the memory layer and the magnetization-fixed layer and is formed of a non-magnetic material. An electron that is spin-polarized is injected in a lamination direction of the layered structure and thereby the magnetization direction of the memory layer varies and a recording of information is performed with respect to the memory layer, a magnitude of an effective diamagnetic field which the memory layer receives is smaller than a saturated magnetization amount of the memory layer, and the memory layer includes at least one of non-magnetic metal and oxide in addition to a Co—Fe—B magnetic layer.

According to another, there is provided a memory device including a memory element that retains information through the magnetization state of a magnetic material, and two kinds of interconnects that intersect each other, wherein the memory element has the configuration of the above-described memory element according to the, the memory element is disposed between the two kinds of interconnects, and a current flows to the memory element in the lamination direction through the two kinds of interconnects, and thereby a spin-polarized electron is injected into the memory element.

According to the configuration of the memory element of the, a memory layer that retains information through a magnetization state of a magnetic material is provided, a magnetization-fixed layer is provided over the memory layer through a intermediate layer, the intermediate layer is formed of an insulating material, an electron that is spin-polarized is injected in a lamination direction and thereby the magnetization direction of the memory layer is changed and a recording of information is performed with respect to the memory layer, and therefore it is possible to perform the recording of the information by flowing a current in the lamination direction and by injecting a spin-polarized electron.

In addition, the magnitude of an effective diamagnetic field which the memory layer receives is smaller than a saturated magnetization amount of the memory layer, such that the diamagnetic field which the memory layer receives decreases, and therefore it is possible to diminish the amount of the write current necessary for inverting the magnetization direction of the memory layer.

On the other hand, it is possible to diminish the amount of the write current even when the saturated magnetization amount of the memory layer is not diminished, such that the saturated magnetization amount of the memory layer becomes sufficient, and it is possible to sufficiently secure thermal stability of the memory layer.

In addition, in regard to the insulating layer and the other side layer, at least a layer of an interface that comes into contact with the memory layer is formed of an oxide film such as MgO film, such that upper and lower interfaces of the memory layer that is a ferromagnetic layer come into contact with the oxide film. In this configuration, the memory layer includes at least one of non-magnetic metal and oxide in addition to a Co—Fe—B magnetic layer. When, oxide is present at the upper and lower sides of the memory layer to which at least one of the non-magnetic metal and the oxide is added, coercive force and thermal stability are improved. This is considered to be because when at least one of the non-magnetic metal and the oxide is added, the memory layer is brought into contact with two oxide layers at upper and lower sides and therefore a Co—O coupling or Fe—O coupling, which is considered as an origin of interface perpendicular magnetic anisotropy, is enhanced.

In addition, according to the configuration of the memory device of the, the memory element is disposed between the two kinds of interconnects, and a current flows to the memory element in the lamination direction through the two kinds of interconnects, and thereby a spin-polarized electron is injected to the memory element. Therefore, it is possible to perform the recording of information by a spin injection by flowing a current in the lamination direction of the memory element through the two kinds of interconnects.

In addition, even when the saturated magnetization amount is not diminished, it is possible to diminish the amount of the write current of the memory element, such that it is possible to stably retain the information recorded in the memory element and it is possible to diminish the power consumption of the memory device.

According to the embodiments of the present disclosure, even when the saturated magnetization amount of the memory layer is not diminished, the amount of the write current of the memory element may be diminished, such that the thermal stability representing the information retaining ability is sufficiently secured, and it is possible to configure a memory element excellent in a characteristic balance.

Particularly, the memory layer comes into contact with the oxide film at both sides thereof, and the memory layer includes at least one of non-magnetic metal and oxide in addition to a Co—Fe—B magnetic layer, such that perpendicular magnetic anisotropy increases, and coercive force and thermal stability are improved.

Therefore, it is possible to realize a memory device that operates stably with high reliability.

In addition, the write current is diminished, such that it is possible to diminish power consumption during performing the writing into the memory element. Therefore, it is possible to diminish the power consumption of the entirety of the memory device.

Additional features and advantages are described herein, and will be apparent from the following Detailed Description and the figures.

BRIEF DESCRIPTION OF THE FIGURES

FIG. 1 is an explanatory view illustrating a schematic configuration of a memory device according to an;

DETAILED DESCRIPTION

Embodiments of the present application will be described below in detail with reference to the drawings.
1. Outline of Memory Element of Embodiment
2. Configuration of Embodiment
3. Experiment
1. Outline of Memory Element of Embodiment
First, outline of a memory element of an embodiment according to the present disclosure will be described.

The embodiment according to the present disclosure performs the recording of information by inverting a magnetization direction of a memory layer of a memory element by the above-described spin injection.

The memory layer is formed of a magnetic material such as ferromagnetic layer, and retains information through the magnetization state (magnetization direction) of the magnetic material.

Figure 2A:
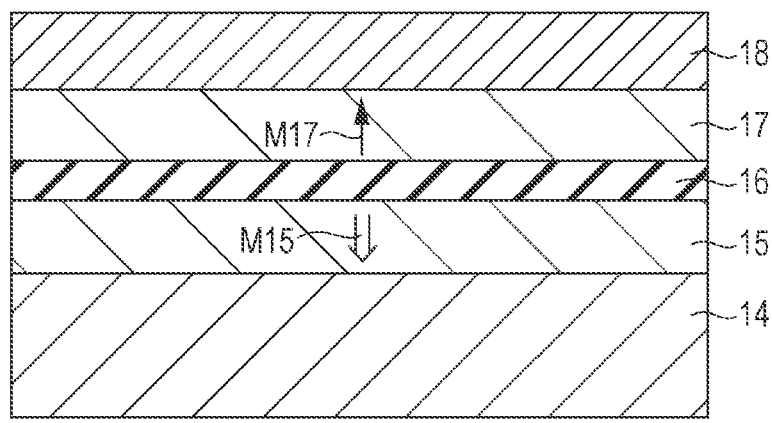
FIGS. 2A and 2B are cross-sectional views illustrating a memory element according the embodiment.
Figure 2B:
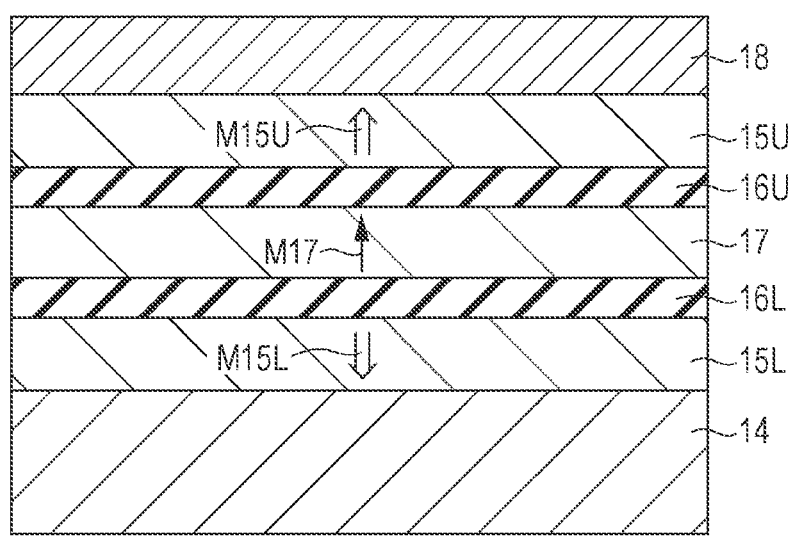

It will be described later in detail, but the memory element has a layered structure whose example is shown in FIGS. 2A and 2B, and includes a memory layer 17 and a magnetization-fixed layer 15 as two magnetic layers, and an insulating layer 16 (tunnel insulating layer) as an intermediate layer provided between the two magnetic layers.

The memory layer 17 has a magnetization perpendicular to a film face and a magnetization direction varies correspondingto information.

The magnetization-fixed layer 15 has a magnetization that is a reference for the information stored in the memory layer 17 and is perpendicular to the film face.

The insulating layer 16 is formed of a non-magnetic material and is provided between the memory layer 17 and the magnetization-fixed layer 15. In this embodiment, the insulating layer 16 is formed of an oxide film, for example, MgO (magnesium oxide).

Spin-polarized electrons are injected in the lamination direction of a laminated structure having the memory layer 17, the insulating layer 16, and the magnetization-fixed layer 15, and the magnetization direction of the memory layer 17 is changed and thereby information is recorded in the memory layer 17.

In this embodiment, the other side layer with which the memory layer 17 comes into contact at the upper side of the memory layer 17, that is, at a side opposite to the insulating layer 16 includes a cap layer 18 (in the case of FIG. 2A) or an upper insulating layer 16U (in the case of FIG. 2B). In this embodiment, at least a face, which comes into contact with the memory layer 17, of the other side layer (for example, a cap layer 18) with which the memory layer 17 comes into contact is formed of an oxide film, for example an MgO (magnesium oxide) film. Therefore, the memory layer 17 comes into contact with an oxide film at both upper and lower interfaces.

A basic operation for inverting the magnetization direction of the magnetic layer (memory layer 17) by spin injection is to make a current of a threshold value or greater flow to the memory element including a giant magnetoresistive effect element (GMR element) or a tunnel magnetoresistive effect element (MTJ element) in a direction perpendicular to a film face. At this time, the polarity (direction) of the current depends on the inverted magnetization direction.

In a case where a current having an absolute value less than the threshold value is made to flow, magnetization inversion does not occur.

A threshold value Ic of a current, which is necessary when the magnetization direction of the magnetic layer is inverted by spin injection, is expressed by the following equation (1).

$$Ic = A \cdot \alpha \cdot Ms \cdot V \cdot Hd / 2\eta \quad (1)$$

Here, A: constant, α: spin braking constant, η: spin injection efficiency, Ms: saturated magnetization amount, V: volume of memory layer, and Hd: effective diamagnetic field.

As expressed by the equation (1), a threshold value of a current may be set to an arbitrary value by controlling the volume V of the magnetic layer, the saturated magnetization Ms of the magnetic layer, and the spin injection efficiency η, and the spin braking constant α, In this embodiment, the memory element includes the magnetic layer (memory layer 17) that is capable of retaining information through the magnetization state, and the magnetization-fixed layer 15 whose magnetization direction is fixed.

The memory element has to retain written information so as to function as a memory. This is determined by a value of an index $\Delta(=KV/k_BT)$ of thermal stability as an index of ability of retaining information. The above-described Δ is expressed by the following equation (2).

$$\Delta = KV/k_BT = Ms \cdot V \cdot H_k^* (1/2k_BT) \quad (2)$$

Here, $H_k$: effective anisotropy field, $k_B$: Boltzmann's constant, T: temperature, Ms: saturated magnetization amount, and V: volume of memory layer.

The effective anisotropy field $H_k$ receives an effect by a shape magnetic anisotropy, an induced magnetic anisotropy, and a crystal magnetic anisotropy, or the like, and when assuming a coherent rotation model of a single domain, the effective anisotropy field becomes the same as the coercive force.

The index Δ of the thermal stability and the threshold value Ic of the current are often in a trade-off relationship. Therefore, compatibility of these becomes an issue to retain the memory characteristic.

In regard to the threshold value of the current that changes the magnetization state of the memory layer 17, actually, for example, in a TMR element in which the thickness of the memory layer 17 is 2 nm, and a planar pattern is substantially an elliptical shape of 100 nm×150 nm, a threshold value+Ic of a positive side is +0.5 mA, a threshold value−Ic of a negative side is −0.3 mA, and a current density at this time is substantially $3.5 \times 10^6$ A/cm$^2$. These substantially correspond to the above-described equation (1).

On the contrary, in a common MRAM that performs a magnetization inversion using a current magnetic field, a write current of several mA or more is necessary.

Therefore, in case of performing magnetization inversion by spin injection, the threshold value of the above-described write current becomes sufficiently small, such that this is effective for diminishing power consumption of an integrated circuit.

In addition, an interconnect (interconnect 105 of FIG. 10) for the generation of the current magnetic field, which is necessary for a common MRAM, is not necessary, such that in regard to the degree of integration, it is advantageous compared to the common MRAM.

In the case of performing the magnetization inversion by spin injection, since the writing (recording) of information is performed by directly flowing a current to the memory element, to select a memory cell that performs the writing, the memory element is connected to a selection transistor to construct the memory cell.

In this case, the current flowing to the memory element is restricted to a current magnitude (saturated current of the selection transistor) that can be made to flow to the selection transistor.

To make the threshold value Ic of a current of the magnetization inversion by the spin injection smaller than the saturated current of the selection transistor, as can be seen from the equation (1), it is effective to diminish the saturated magnetization amount Ms of the memory layer 17.

However, in the case of simply diminishing the saturated magnetization amount Ms (for example, U.S. Pat. No. 7,242,045), the thermal stability of the memory layer 17 is significantly deteriorated, and therefore it is difficult for the memory element to function as a memory.

To construct the memory, it is necessary that the index Δ of the thermal stability is equal to or greater than a magnitude of a certain degree.

The present inventors have made various studies, and as a result thereof, they have found that when for example, a composition of Co—Fe—B is selected as the ferromagnetic layer making up the memory layer 17, the magnitude of the effective diamagnetic field ($M_{effective}$) which the memory layer 17 receives becomes smaller than the saturated magnetization amount Ms of the memory layer 17.

By using the above-described ferromagnetic material, the magnitude of the effective diamagnetic field which the memory layer 17 receives becomes smaller than the saturated magnetization amount Ms of the memory layer 17.

In this manner, it is possible to make the diamagnetic field which the memory layer 17 receives small, such that it is possible to obtain an effect of diminishing the threshold value Ic of a current expressed by the equation (1) without deteriorating the thermal stability Δ expressed by the equation (2).

In addition, the present inventors has found that Co—Fe—B magnetizes in a direction perpendicular to a film face within a restricted composition range of the selected Co—Fe—B composition, and due to this, it is possible to secure a sufficient thermal stability even in the case of a extremely minute memory element capable of realizing Gbit class capacity.

Therefore, in regard to a spin injection-type memory of the Gbit, it is possible to make a stable memory in which information may be written with a low current in a state where the thermal stability is secured.

In this embodiment, it is configured such that the magnitude of the effective diamagnetic field which the memory layer 17 receives is made to be less than the saturated magnetization amount Ms of the memory layer 17, that is, a ratio of the magnitude of the effective diamagnetic field with respect to the saturated magnetization amount Ms of the memory layer 17 becomes less than 1.

In addition, a magnetic tunnel junction (MTJ) element is configured by using a tunnel insulating layer (insulating layer 16) formed of an insulating material as the non-magnetic intermediate layer disposed between the memory layer 17 and the magnetization-fixed layer 15 in consideration of the saturated current value of the selection transistor.

The magnetic tunnel junction (MTJ) element is configured by using the tunnel insulating layer, such that it is possible to make a magnetoresistance change ratio (MR ratio) large compared to a case where a giant magnetoresistive effect (GMR) element is configured by using a non-magnetic conductive layer, and therefore it is possible to increase the read-out signal strength.

Particularly, when magnesium oxide (MgO) is used as the material of the tunnel insulating layer 16, it is possible to make the magnetoresistance change ratio (MR ratio) large compared to a case where aluminum oxide, which can be generally used, is used.

In addition, generally, spin injection efficiency depends on the MR ratio, and the larger the MR ratio, the more spin injection efficiency is improved, and therefore it is possible to diminish the magnetization inversion current density.

Therefore, when magnesium oxide is used as the material of the tunnel insulating layer 16 and the memory layer 17 is used, it is possible to diminish the threshold write current by spin injection and therefore it is possible to perform the writing (recording) of information with a small current. In addition, it is possible to increase the read-out signal strength.

In this manner, it is possible to diminish the threshold write current by spin injection by securing the MR ratio (TMR ratio), and it is possible to perform the writing (recording) of information with a small current. In addition, it is possible to increase the read-out signal strength.

As described above, in a case where the tunnel insulating layer 16 is formed of the magnesium oxide (MgO) film, it is desirable that the MgO film be crystallized and therefore a crystal orientation be maintained in (001) direction.

In addition, in this embodiment, in addition to a configuration formed of the magnesium oxide, the insulating layer 16 as an intermediate layer disposed between the memory layer 17 and the magnetization-fixed layer 15 may be configured by using, for example, various insulating materials, dielectric materials, and semiconductors such as aluminum oxide, aluminum nitride, $SiO_2$, $Bi_2O_3$, $MgF_2$, CaF, $SrTiO_2$, $AlLaO_3$, and Al—N—O.

However, in this embodiment, at least an interface that comes into contact with the memory layer 17 is formed of an oxide film.

An area resistance value of the tunnel insulating layer 16 is necessary to be controlled to several tens Ωμm$^2$ or less in consideration of the viewpoint of obtaining a current density necessary for inverting the magnetization direction of the memory layer 17 by spin injection.

In the tunnel insulating layer 16 formed of the MgO film, to retain the area resistance value within the above-described range, it is necessary to set the film thickness of the MgO film to 1.5 nm or less.

In addition, it is desirable to make the memory element small to easily invert the magnetization direction of the memory layer 17 with a small current.

Therefore, preferably, the area of the memory element is set to 0.01 $\mu m^2$ or less.

It is desirable that the magnetization-fixed layer 15 and the memory layer 17 have a unidirectional anisotropy. In addition, it is preferable that the film thickness of each of the magnetization-fixed layer 15 and the memory layer 17 be 0.5 to 30 nm.

Here, the memory layer 17 of this embodiment includes a Co—Fe—B magnetic layer as a main body, but at least one side of a non-magnetic metal (including Ti, V, Nb, Zr, Ta, Hf, and Y), and oxide (including MgO, $siO_2$, Al—O) is added to this magnetic layer.

In regard to the memory layer 17 in which the oxide is present at the upper and lower sides thereof and at least one of the non-magnetic metal and the oxide is added thereto, perpendicular magnetic anisotropy is enhanced compared to the case of a single layer of a Co—Fe—B magnetic layer alone, and coercive force and thermal stability $KV/k_BT$ are stably improved.

This is considered to be because when at least one of the non-magnetic metal and the oxide is added, the memory layer is brought into contact with two oxide layers and therefore a Co—O coupling or Fe—O coupling, which is considered to as an origin of interface perpendicular magnetic anisotropy, is enhanced.

Other configuration of the memory element may be the same as the configuration of a memory element that records information by spin injection in the related art.

The magnetization-fixed layer 15 may be configured in such a manner that the magnetization direction is fixed by only a ferromagnetic layer or by using an anti-ferromagnetic combination of an anti-ferromagnetic layer and a ferromagnetic layer.

In addition, the magnetization-fixed layer 15 may be configured by a single layer of a ferromagnetic layer, or a ferri-pin structure in which a plurality of ferromagnetic layers are laminated through a non-magnetic layer.

As a material of the ferromagnetic layer making up the magnetization-fixed layer 15 of the laminated ferri-pin structure, Co, CoFe, CoFeB, or the like may be used. In addition, as a material of the non-magnetic layer, Ru, Re, Ir, Os, or the like may be used.

As a material of the anti-ferromagnetic layer, a magnetic material such as an FeMn alloy, a PtMn alloy, a PtCrMn alloy, an NiMn alloy, an IrMn alloy, NiO, and Fe2O3 may be exemplified.

In addition, a magnetic characteristic may be adjusted by adding a non-magnetic element such as Ag, Cu, Au, Al, Si, Bi, Ta, B, C, O, N, Pd, Pt, Zr, Hf, Ir, W, Mo, and Nb to the above-describe magnetic materials, or in addition to this, various physical properties such as a crystalline structure, a crystalline property, a stability of a substance, or the like may be adjusted.

In addition, in relation to a film configuration of the memory element, the memory layer 17 may be disposed at the lower side of the magnetization-fixed layer 15, or at the upper side thereof, and in any disposition, there is no problem at all.

In addition, as shown in FIG. 2B, the magnetization-fixed layer 15 may be disposed at the upper side and the lower side of the memory layer 17, so-called dual-structure.

In addition, as a method of reading-out information recorded in the memory layer 17 of the memory element, a magnetic layer that becomes a reference for the information is provided on the memory layer 17 of the memory element through a thin insulating film, and the reading-out may be performed by a ferromagnetic tunnel current flowing through the insulating layer 16, or the reading-out may be performed by a magnetoresistive effect.

2. Configuration of Embodiment

Subsequently, a specific configuration of this will be described.

Figure 1:
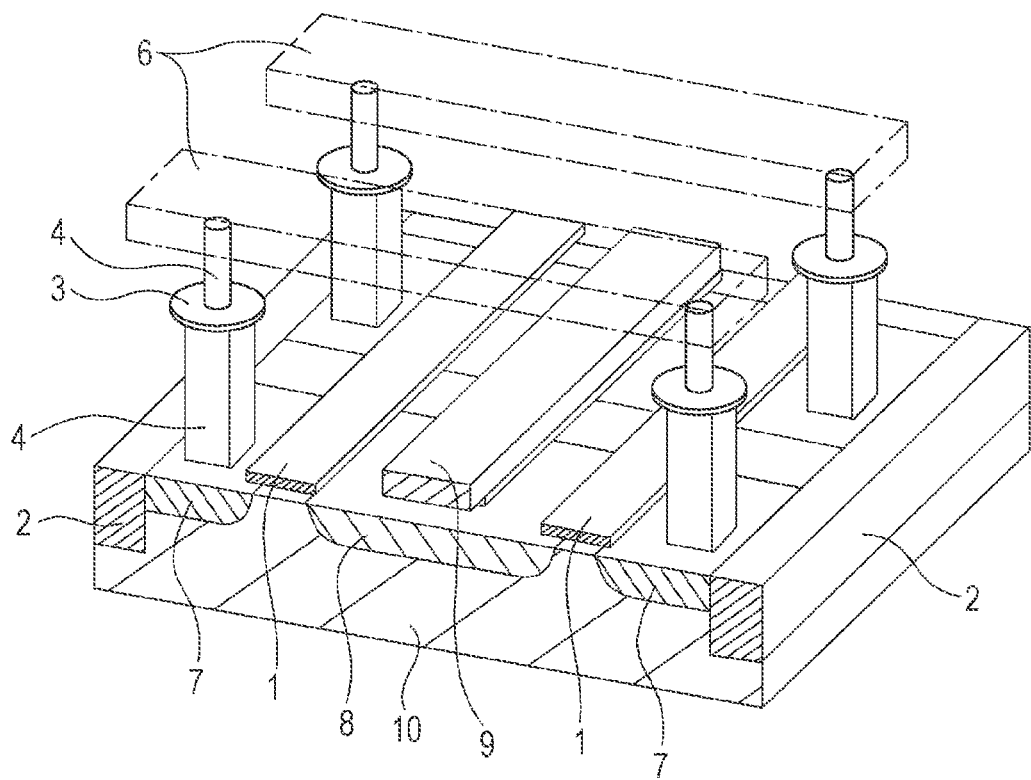

As an, a schematic configuration diagram (perspective view) of a memory device is shown in FIG. 1.

This memory device includes a memory element 3, which can retain information at the magnetization state, disposed in the vicinity of an intersection of two kinds of address interconnects (for example, a word line and a bit line) that are perpendicular to each other.

Specifically, a drain region 8, a source region 7, and a gate electrode 1 that make up a selection transistor that selects each memory cell are formed in a portion separated by an element separation layer 2 of a semiconductor substrate 10 such as a silicon substrate, respectively. Among them, the gate electrode 1 also functions as one side address interconnect (for example, a word line) that extends in the front-back direction in the drawing.

The drain region 8 is formed commonly with left and right selection transistors in the drawing, and an interconnect 9 is connected to the drain region 8.

The memory element 3 is disposed between the source region 7, and the other side address interconnect (for example, a bit line) 6 that is disposed at the upper side and extends in the left-right direction in the drawing. This memory element 3 has a memory layer including a ferromagnetic layer whose magnetization direction is inverted by spin injection.

In addition, the memory element 3 is disposed in the vicinity of an intersection of two kinds of address interconnects 1 and 6.

The memory element 3 is connected to the bit line 6 and the source region 7 through upper and lower contact layers 4, respectively.

In this manner, a current flows into the memory element 3 in the perpendicular direction thereof through the two kind of address interconnects 1 and 6, and the magnetization direction of the memory layer may be inverted by a spin injection.

In addition, a cross-sectional view of the memory element 3 of the memory device according to this embodiment is shown in FIGS. 2A and 2B.

First, FIG. 2A is an example of so-called a single structure, and in the memory element 3, an underlying layer 14, the magnetization-fixed layer 15, the insulating layer 16, the memory layer 17, and the cap layer 18 are laminated in this order from a lower layer side.

In this case, the magnetization-fixed layer 15 is provided at a lower layer in relation to a memory layer 17 in which the magnetization direction of a magnetization M17 is inverted by a spin injection.

In regard to the spin injection type memory, "0" and "1" of information are defined by a relative angle between the magnetization M17 of the memory layer 17 and a magnetization M15 of the magnetization-fixed layer 15.

An insulating layer 16 that serves as a tunnel barrier layer (tunnel insulating layer) is provided between the memory layer 17 and the magnetization-fixed layer 15, and therefore an MTJ element is configured by the memory layer 17 and the magnetization-fixed layer 15. In addition, an anti-ferromagnetic layer 19 is formed under the magnetization-fixed layer 15.

The memory layer 17 is formed of a ferromagnetic material having a magnetic moment in which the direction of a magnetization M17 is freely changed in a direction perpendicular to a film face. The magnetization-fixed layer 15 is formed of a ferromagnetic material having a magnetic moment in which a magnetization M15 is fixed in the direction perpendicular to the film face.

The storage of information is performed by a magnetization direction of the memory layer 17 having a unidirectional anisotropy. The writing of information is performed by applying a current in the direction perpendicular to the film face and by causing a spin torque magnetization inversion. In this way, the magnetization-fixed layer 15 is provided at a lower layer in relation to the memory layer 17 in which the magnetization direction is inverted by the spin injection, and serves as a reference for the memory information (magnetization direction) of the memory layer 17.

In this embodiment, Co—Fe—B is used for the memory layer 17 and the magnetization-fixed layer 15. Particularly, the memory layer 17 is configured in such a manner that at least one of non-magnetic metal and oxide is added thereto.

The magnetization-fixed layer 15 serves as the reference for the information, such that it is necessary that the magnetization direction does not vary, but it is not necessarily necessary to be fixed in a specific direction. The magnetization-fixed layer 15 may be configured in such a manner that migration becomes more difficult than in the memory layer 17 by making a coercive force large, by making the film thickness large, or by making a damping constant large compared to the memory layer 17.

In the case of fixing the magnetization, an anti-ferromagnetic material such as PtMn and IrMn may be brought into contact with the magnetization-fixed layer 15, or a magnetic material brought into contact with such an anti-ferromagnetic material may be magnetically combined through a non-magnetic material such as Ru, and thereby the magnetization-fixed layer 15 may be indirectly fixed.

Next, FIG. 2B is an example of a layered structure of a dual structure as the embodiment.

In the memory element 3, from a lower layer side, an underlying layer 14, a lower magnetization-fixed layer 15L, a lower insulating layer 16L, a memory layer 17, an upper insulating layer 16U, an upper magnetization-fixed layer 15U, and a cap layer 18 are laminated in this order.

That is, the magnetization-fixed layers 15U and 15L are provided with respect to the memory layer 17 at upper and lower sides thereof through the insulating layer 16U and 16L.

In this case, Co—Fe—B is also used for the memory layer 17, the lower magnetization-fixed layer 15L, and the upper magnetization-fixed layer 15U. Particularly, the memory layer 17 is configured in such a manner that at least one of non-magnetic metal and oxide is added to the Co—Fe—B.

The lower insulating layer 16L and the upper insulating layer 16U is configured by an oxide film such as MgO.

In addition, in such a dual structure, it is necessary that the magnetization direction of the magnetization-fixed layers 15U and 15L is not changed (magnetization M15U of the upper magnetization-fixed layer 15U and magnetization M15L of the lower magnetization-fixed layer 15L are inverted from each other).

In the embodiment shown in FIGS. 2A and 2B, particularly, a composition of the memory layer 17 of the memory element 3 is adjusted such that a magnitude of an effective diamagnetic field which the memory layer 17 receives becomes smaller than the saturated magnetization amount Ms of the memory layer 17.

That is, a composition of a ferromagnetic material Co—Fe—B of the memory layer 17 is selected, and the magnitude of the effective diamagnetic field which the memory layer 17 receives is made to be small, such that the magnitude of the effective diamagnetic field becomes smaller than the saturated magnetization amount Ms of the memory layer 17.

In addition, in this embodiment, in a case where the insulating layer 16 that is an intermediate layer is formed of a magnesium oxide (MgO) layer. In this case, it is possible to make a magnetoresistive change ratio (MR ratio) high.

When the MR ratio is made to be high as described above, the spin injection efficiency is improved, and therefore it is possible to diminish a current density necessary for inverting the direction of the magnetization M17 of the memory layer 17.

In this embodiment, in the case of the single structure shown in FIG. 2A, at least an interface of the cap layer 18, which comes into contact with the memory layer 17, is formed of oxide such as an MgO film. In addition, the insulating layer 16 is also formed of MgO. Therefore, the memory layer 17 formed of Co—Fe—B as a main component is configured to come into contact with an oxide film at both faces.

In the case of the dual structure shown in FIG. 2B, at least an interface of the upper and lower insulating layers 16U and 16L, which comes into contact with the memory layer 17, is formed of oxide such as an MgO film. Therefore, the memory layer 17 formed of Co—Fe—B as a main component is configured to come into contact with an oxide film at both faces.

The memory element 3 of this embodiment can be manufactured by continuously forming from the underlying layer 14 to the cap layer 18 in a vacuum apparatus, and then by forming a pattern of the memory element 3 by a processing such as a subsequent etching or the like.

According to the above-described embodiment, the memory layer 17 of the memory element 3 is configured in such a manner that the magnitude of the effective diamagnetic field that the memory layer 17 receives is smaller than the saturated magnetization amount Ms of the memory layer 17, such that the diamagnetic field that the memory layer 17 receives is decreased, and it is possible to diminish an amount of the write current necessary for inverting the direction of the magnetization M17 of the memory layer 17.

On the other hand, since the amount of the write current may be diminished even when the saturated magnetization amount Ms of the memory layer 17 is not diminished, it is possible to sufficiently secure the saturated magnetization amount of the memory layer 17 and therefore it is possible to sufficiently secure the thermal stability of the memory layer 17.

As described above, since it is possible to sufficiently secure the thermal stability that is an information retaining ability, it is possible to configure the memory element 3 excellent in a characteristic balance.

Particularly, when both faces of the memory layer 17 come into contact with an oxide film, and the memory layer 17 is configured in such a manner that at least one of the non-magnetic metal and the oxide is added to the Co—Fe—B, perpendicular magnetic anisotropy is increased and therefore it is more advantageous in regard to the increase in the coercive force and the thermal stability.

In this way, an operation error is removed and an operation margin of the memory element 3 is sufficiently obtained, such that it is possible to stably operate the memory element 3.

Accordingly, it is possible to realize a memory that operates stably with high reliability.

In addition, the write current is diminished, such that it is possible to diminish the power consumption when performing the writing into the memory element 3.

Therefore, it is possible to diminish the power consumption of the entirety of the memory device in which a memory cell is configured by the memory element 3 of this embodiment.

Therefore, in regard to the memory device including the memory element 3 capable of realizing a memory device that is excellent in information retaining ability, has high reliability, and operates stably, it is possible to diminish the power consumption in a memory device including the memory element.

Figure 3:
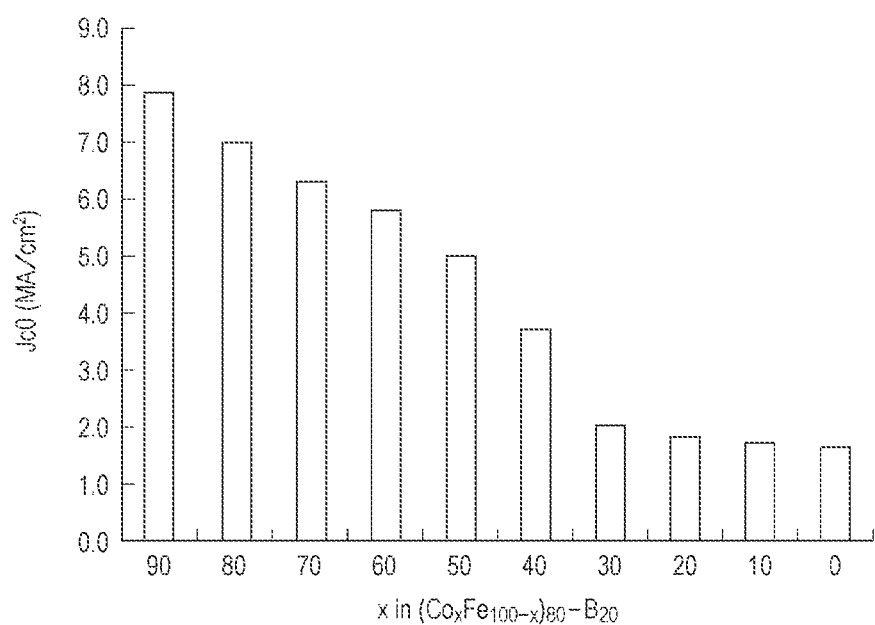
FIG. 3 is a diagram illustrating a relationship between an amount of Co of a memory layer of 0.09×0.18 μm size and an inversion current density.

In addition, the memory device that includes a memory element 3 shown in FIGS. 2A and 3A and has a configuration shown in FIG. 1 has an advantage in that a general semiconductor MOS forming process may be applied when the memory device is manufactured.

Therefore, it is possible to apply the memory device of this embodiment as a general purpose memory.

3. Experiment

Here, in regard to the configuration of the memory element of this embodiment, by specifically selecting the material of the ferromagnetic layer making up the memory layer 17, the magnitude of the effective diamagnetic field that the memory layer 17 receives was adjusted, and thereby a sample of the memory element 3 was manufactured, and then characteristics thereof was examined.

In an actual memory device, as shown in FIG. 1, a semiconductor circuit for switching or the like present in addition to the memory element 3, but here, the examination was made on a wafer in which only the memory element is formed for the purpose of investigating a magnetization inversion characteristic of the memory layer 17.

In addition, in the following experiments 1 to 4, investigation is made into a configuration where a magnitude of the effective diamagnetic field which the memory layer 17 receives is made to be small, and thereby the magnitude of an effective diamagnetic field which the memory layer receives is smaller than a saturated magnetization amount of the memory layer 17, by selecting a composition of the ferromagnetic material, that is, Co—Fe—B of the memory layer 17.

In addition, in experiments 5 and 6, investigation is made into an advantage due to a configuration in which the upper and lower interfaces of the memory layer 17 comes into contact with oxide and due to a structure in which the memory layer 17 is formed of Co—Fe—B to which at least one of the non-magnetic metal and the oxide is added, instead of being formed of a single layer of Co—Fe—B.

Experiment 1

A thermal oxide film having a thickness of 300 nm was formed on a silicon substrate having a thickness of 0.725 mm, and the memory element 3 having a configuration shown in FIG. 2B was formed on the thermal oxide film.

Specifically, in regard to the memory element 3 shown in FIG. 2B, a material and a film thickness of each layer were selected as described below.

Underlying layer 14: Laminated film of a Ta film having a film thickness of 10 nm and a Ru film having a film thickness of 25 nm Magnetization-fixed layer 15: CoFeB film having a film thickness of 2.5 nm Tunnel insulating layer 16: Magnesium oxide film having a film thickness of 0.9 nm Memory layer 17: CoFeB film having the same composition as that of the magnetization-fixed layer Cap layer 18: Laminated film of a Ta film having a film thickness of 3 nm, a Ru film having a thickness of 3 nm, and a Ta film having a thickness of 3 nm Each layer was selected as described above, a Cu film (not shown) having a film thickness of 100 nm (serving as a word line described below) was provided between the underlying layer 14 and the silicon substrate.

In the above-described configuration, the ferromagnetic layer of the memory layer 17 was formed of a ternary alloy of Co—Fe—B, and a film thickness of the ferromagnetic layer was fixed to 2.0 nm.

Each layer other than the insulating layer 16 formed of a magnesium oxide film was formed using a DC magnetron sputtering method.

The insulating layer 16 formed of the magnesium oxide (MgO) film was formed using a RF magnetron sputtering method.

In addition, after forming each layer of the memory element 3, a heating treatment was performed in a magnetic field heat treatment furnace.

Next, after masking a word line portion by a photolithography, a selective etching by Ar plasma was performed with respect to a laminated film other than the word line portion, and thereby the word line (lower electrode) was formed.

At this time, a portion other than the word line was etched to the depth of 5 nm in the substrate.

Then, a mask of a pattern of the memory element 3 by an electron beam drawing apparatus was formed, a selective etching was performed with respect to the laminated film, and thereby the memory element 3 was formed. A portion other than the memory element 3 was etched to a portion of the word line immediately over the Cu layer.

In addition, in the memory element for the characteristic evaluation, it is necessary to make a sufficient current flow to the memory element so as to generate a spin torque necessary for the magnetization inversion, such that it is necessary to suppress the resistance value of the tunnel insulating layer. Therefore, a pattern of the memory element 3 was set to an elliptical shape having a short axis of 0.09 μm×a long axis of 0.18 μm, and an area resistance value (Ωμm2) of the memory element 3 was set to 20 Ωμm2.

Next, a portion other than the memory element 3 was insulated by sputtering Al2O3 to have a thickness of substantially 100 nm.

Then, a bit line serving as an upper electrode and a measurement pad were formed by using photolithography.

In this manner, a sample of the memory element 3 was manufactured.

By the above-described manufacturing method, each sample of the memory element 3 in which a composition of Co—Fe—B alloy of the ferromagnetic layer of the memory layer 17 was changed was manufactured.

In the composition of the Co—Fe—B alloy, a composition ratio of CoFe and B was fixed to 80:20, and a composition ratio of Co in CoFe, that is, x (atomic %) was changed to 90%, 80%, 70%, 60%, 50%, 40%, 30%, 20%, 10%, and 0%.

With respect to each sample of the memory element 3 manufactured as described above, a characteristic evaluation was performed as described below.

Before the measurement, it was configured to apply a magnetic field to the memory element 3 from the outside to control an inversion current in such a manner that a value in a plus direction and a value in a minus direction to be symmetric to each other.

In addition, a voltage applied to the memory element 3 was set up to 1 V within a range without breaking down the insulating layer 16.

Measurement of Saturated Magnetization Amount

The saturated magnetization amount Ms was measured by a VSM measurement using a Vibrating Sample Magnetometer.

Measurement of Effective Diamagnetic Field

As a sample for measuring an effective diamagnetic field, in addition to the above-described sample of the memory element 3, a sample in which each layer making up the memory element 3 was formed was manufactured and then the sample was processed to have a planar pattern of 20 mm×20 mm square.

In addition, a magnitude $M_{effective}$ of an effective diamagnetic field was obtained by FMR (Ferromagnetic Resonance) measurement.

A resonance frequency fFMR, which is obtained by the FMR measurement, with respect to arbitrary external magnetic field $H_{ex}$ is given by the following equation (3).

$$f_{FMR} = \gamma \sqrt{4\pi M_{effective}(H_K + H_{ex})} \quad (3)$$

Here, $M_{effective}$ in the equation (3) may be expressed by $4\pi M_{effective} = 4\pi Ms - H\perp$ (H⊥: anisotropy field in a direction perpendicular to a film face).

Measurement of Inversion Current Value and Thermal Stability

An inversion current value was measured for the purpose of evaluating the writing characteristic of the memory element 3 according to this embodiment.

A current having a pulse width of 10 is to 100 ms is made to flow to the memory element 3, and then a resistance value of the memory element 3 was measured.

In addition, the amount of current that flows to the memory element 3 was changed, and then a current value at which a direction of the magnetization M17 of the memory layer 17 of the memory element 3 was inverted was obtained. A value obtained by extrapolating a pulse width dependency of this current value to a pulse width 1 ns was set to the inversion current value.

In addition, the inclination of a pulse width dependency of the inversion current value corresponds to the above-described index Δ of the thermal stability of the memory element 3. The less the inversion current value is changed (the inclination is small) by the pulse width, the more the memory element 3 is strengthened against thermal disturbance.

In addition, twenty memory elements 3 with the same configuration were manufactured to take variation in the memory element 3 itself into consideration, the above-described measurement was performed, and an average value of the inversion current value and the index Δ of the thermal stability were obtained.

In addition, an inversion current density Jc0 was calculated from the average value of the inversion current value obtained by the measurement and an area of the planar pattern of the memory element 3.

In regard to each sample of the memory element 3, a composition of Co—Fe—B alloy of the memory layer 17, measurement results of the saturated magnetization amount Ms and the magnitude $M_{effective}$ of the effective diamagnetic field, and a ratio $M_{effective}$/Ms of effective diamagnetic field to the saturated magnetization amount were shown in Table 1. Here, an amount x of Co of Co—Fe—B alloy of the memory layer 17 described in Table 1 was expressed by an atomic %.

TABLE 1

| | Ms (emu/cc) | Meffctive (emu/cc) | Meffective/Ms |
|---|---|---|---|
| $(Co_{90}Fe_{10})_{80}$—$B_{20}$ | 960 | 1210 | 1.26 |
| $(Co_{80}Fe_{20})_{80}$—$B_{20}$ | 960 | 1010 | 1.05 |
| $(Co_{70}Fe_{30})_{80}$—$B_{20}$ | 1040 | 900 | 0.87 |
| $(Co_{60}Fe_{40})_{80}$—$B_{20}$ | 1200 | 830 | 0.69 |
| $(Co_{50}Fe_{50})_{80}$—$B_{20}$ | 1300 | 690 | 0.53 |
| $(Co_{40}Fe_{60})_{80}$—$B_{20}$ | 1300 | 500 | 0.38 |
| $(Co_{30}Fe_{70})_{80}$—$B_{20}$ | 1260 | 390 | 0.31 |
| $(Co_{20}Fe_{80})_{80}$—$B_{20}$ | 1230 | 360 | 0.29 |
| $(Co_{10}Fe_{90})_{80}$—$B_{20}$ | 1200 | 345 | 0.29 |
| $Fe_{80}$—$B_{20}$ | 1160 | 325 | 0.28 |

From the table 1, in a case where the amount x of Co in $(Co_xFe_{100-x})_{80}B_{20}$ was 70% or less, the magnitude of the effective diamagnetic field ($M_{effective}$) was smaller than the saturated magnetization amount Ms, that is, the ratio of $M_{effective}$/Ms in a case where the amount x of Co was 70% or less became a value less than 1.0.

In addition, it was confirmed that the more the amount x of Co decreased, the larger the difference between $M_{effective}$ and Ms.

Figure 4:
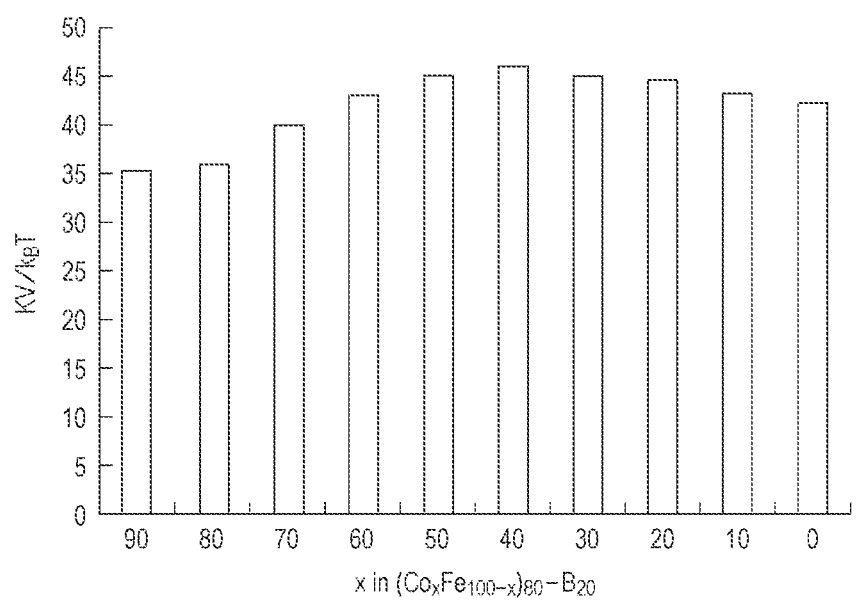
FIG. 4 is a diagram illustrating a relationship between an amount of Co of a memory layer of 0.09×0.18 μm size and an index of thermal stability.
Figure 5:
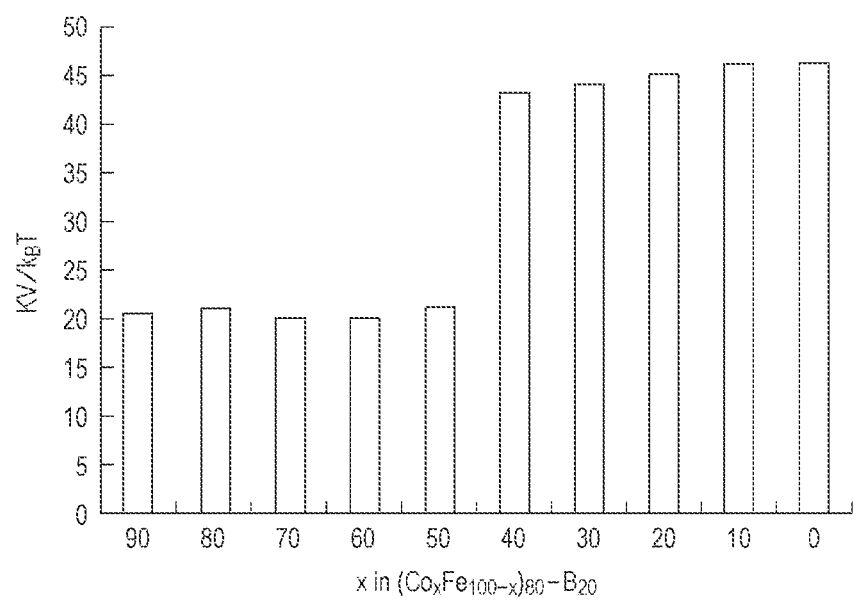
FIG. 5 is a diagram illustrating a relationship between an amount of Co of a memory layer of 50 nm φ size and an index of thermal stability.

A measurement result of the inversion current value was shown in FIG. 4, and a measurement result of the index of the thermal stability was shown in FIG. 5.

FIG. 4 shows a relationship between the amount x (content in CoFe; atomic %) of Co in the Co—Fe—B alloy of the memory layer 17 and the inversion current density Jc0 obtained from the inversion current value.

FIG. 5 shows a relationship between an amount x (content in CoFe; atomic %) of Co in the Co—Fe—B alloy of the memory layer 17 and the index Δ(KV/kBT) of the thermal stability.

As can be seen from FIG. 4, as the amount x of Co decreases, the inversion current density Jc0 decreases.

This is because in a case where the amount x of Co becomes small, the saturated magnetization amount Ms increases, but the effective diamagnetic field $M_{effective}$ decreases, and therefore the product of them Ms×$M_{effective}$ becomes small.

As can be seen from FIG. 5, as the amount x of Co decreased, the index Δ(=KV/$k_B$T) of the thermal stability increased, and in a case where the amount x of Co became more or less small to a degree, the index Δ of the thermal stability became stable to a large value.

This well corresponds to a change that is expected from the measurement result of the saturated magnetization amount Ms shown in Table 1 and a tendency where the index Δ of the thermal stability from the equation (2) is proportional to the saturated magnetization amount Ms.

As was clear from the results of Table 1, FIGS. 4 and 5, in a composition where the amount x of Co was 70% or less and the magnitude $M_{effective}$ of effective diamagnetic field was less than the saturated magnetization amount Ms, it was possible to diminish the inversion current value Jc0 with a high thermal stability maintained, without using a method in which Ms was decreased and therefore the thermal stability was sacrificed.

Experiment 2

As can be seen from the Experiment 1, in the case of $(Co_xFe_{100-x})_{80}B_{20}$, it was possible to diminish the inversion current value Jc0 with a high thermal stability maintained in a composition where the amount x of Co was 70% or less.

Therefore, in experiment 2, an effect on a ratio of Co and Fe, and the $M_{effective}$/Ms, which was caused by an amount of B, was examined by using a memory layer 17 having a composition $(Co_{70}Fe_{30})_{80}B_z$ and a composition $(Co_{80}Fe_{20})_{80}B_z$. The details of a sample were substantially the same as those in the experiment 1.

Table 2 shows compositions of CoFeB alloy in which the amount z of B was set to 5 to 40% in $(Co_{70}Fe_{30})_{100-z}B_z$, results of measurement of the saturated magnetization amount Ms and the magnitude $M_{effective}$ of the effective diamagnetic field, and a ratio $M_{effective}$/MS of the saturated magnetization amount and the magnitude of the effective diamagnetic field.

In addition, Table 3 shows compositions of CoFeB alloy in which the amount z (atomic %) of B was similarly set to 5 to 40% in $(Co_{80}Fe_{20})_{100-z}B_z$, and a ratio $M_{effective}$/MS of the saturated magnetization amount Ms and the magnitude $M_{effective}$ of the effective diamagnetic field.

TABLE 2

| | Ms (emu/cc) | Meffective (emu/cc) | Meffective/Ms |
|---|---|---|---|
| $(Co_{70}Fe_{30})_{95}$—$B_5$ | 1310 | 1090 | 0.83 |
| $(Co_{70}Fe_{30})_{90}$—$B_{10}$ | 1250 | 1080 | 0.89 |
| $(Co_{70}Fe_{30})_{80}$—$B_{20}$ | 1040 | 900 | 0.87 |
| $(Co_{70}Fe_{30})_{70}$—$B_{30}$ | 820 | 730 | 0.89 |
| $(Co_{70}Fe_{30})_{60}$—$B_{40}$ | 450 | 690 | 1.53 |

TABLE 3

| | Ms (emu/cc) | Meffective (emu/cc) | Meffective/Ms |
|---|---|---|---|
| $(Co_{80}Fe_{20})_{95}$—$B_5$ | 1250 | 1280 | 1.02 |
| $(Co_{80}Fe_{20})_{90}$—$B_{10}$ | 1100 | 1140 | 1.04 |
| $(Co_{80}Fe_{20})_{80}$—$B_{20}$ | 960 | 1010 | 1.05 |
| $(Co_{80}Fe_{20})_{70}$—$B_{30}$ | 750 | 890 | 1.19 |
| $(Co_{80}Fe_{20})_{60}$—$B_{40}$ | 430 | 690 | 1.60 |

From the results of Table 2, it can be confirmed that in a case where the ratio of Co and Fe was set to 70/30 like $(Co_{70}Fe_{30})_{100-z}B_z$, the magnitude $M_{effective}$ of the effective diamagnetic field was smaller than the saturated magnetization amount Ms in compositions other than a composition where the amount z of B was 40 atomic %.

From the results of Table 3, it can be confirmed that in a case where the ratio of Co and Fe was set to 80/20 like $(Co_{80}Fe_{20})_{100-z}B_z$, the magnitude $M_{effective}$ of the effective diamagnetic field was larger than the saturated magnetization amount Ms in all compositions.

From the results of the above-described Tables 1 to 3, it was revealed that in a case where the amount z of B is within a range of 30 atomic % or less, a magnitude correlation of the saturated magnetization amount Ms and the magnitude $M_{effective}$ of the effective diamagnetic field is determined by the ratio of Co and Fe.

Therefore, a composition of the Co—Fe—B alloy where the magnitude $M_{effective}$ of the effective diamagnetic field is less than the saturated magnetization amount Ms of the memory layer 17 is as follows:

$(Co_x$—$Fe_y)_{100-z}$—$B_z$,

Here, $0 \leq Co_x \leq 70$,
$30 \leq Fe_y \leq 100$,
$0 < B_z \leq 30$.

Experiment 3

In a spin injection type memory of the Gbit class, it was assumed that the size of the memory element is 100 nmϕ. Therefore, in experiment 3, the thermal stability was evaluated by using a memory element having the size of 50 nmϕ.

In the composition of Co—Fe—B alloy, a composition ratio (atomic %) of CoFe and B was fixed to 80:20, and a composition ratio x (atomic %) of Co in CoFe was changed to 90%, 80%, 70%, 60%, 50%, 40%, 30%, 20%, 10%, and 0%.

The details of the sample other than the sample size were substantially the same as those in the experiment 1.

In a case where the size of the memory element 3 was 50 nmϕ, a relationship between an amount of Co (content in CoFe; atomic %) in the Co—Fe—B alloy, and the index $\Delta(KV/k_BT)$ of thermal stability were shown in FIG. 6.

As can be seen from FIG. 6, when the element size was 50 nmϕ, Co—Fe—B alloy composition dependency of the thermal stability index Δ was largely varied from the Co—Fe—B alloy composition dependency of 4 obtained in the elliptical memory element having a short axis of 0.09 μm×a long axis of 0.18 win shown in FIG. 5.

According to FIG. 6, the high thermal stability was maintained only in the case of Co—Fe—B alloy composition where Fe is 60 atomic % or more.

As a result of various reviews, it was clear that the reason why the Co—Fe—B alloy containing Fe of 60 atomic % or more shows the high thermal stability Δ in the extremely minute memory element was revealed to be because the magnetization of the Co—Fe—B alloy faced a direction perpendicular to a film face.

The reason why the magnetization of the Co—Fe—B alloy faces the direction perpendicular to the film face is considered to be because of a composition in which the magnitude $M_{effective}$ of the effective diamagnetic field is significantly smaller than the saturated magnetization amount Ms.

In addition, the reason why the thermal stability is secured even in the case of the extremely minute element of a perpendicular magnetization film is related to Hk (effective anisotropy field) in the equation (2), and Hk of the perpendicular magnetization film becomes a value significantly larger than that in the in-plane magnetization film. That is, in the perpendicular magnetization film, due to an effect of large Hk, it is possible to maintain a high thermal stability Δ even in the case of the extremely minute element not capable of securing a sufficient thermal stability Δ in the in-plane magnetization film.

From the above-described experiment results, in regard to the Co—Fe—B alloy having a composition of $(Co_xFe_{100-x})_{80}B_{20}$, in a case where the amount of $Fe_{100-x}$ is 60 or more, this alloy may be said to be suitable for the memory device of the Gbit class using the spin injection.

Experiment 4

As can be seen from the above-described experiment 3, in a case the amount of F was 60 or more in the Co—Fe—B alloy having a composition of $(Co_xFe_{100-x})_{80}B_{20}$, this alloy was suitable for the memory device of the Gbit class using the spin injection. In experiment 4, a memory element having the size of 50 nmϕ was manufactured using the Co—Fe—B alloy containing B in an amount of 5 to 30 atomic %, and the thermal stability was evaluated.

The details other than the element size were substantially the same as those in the experiment 1.

A relationship between the index $\Delta(KV/k_BT)$ of the thermal stability and the Co—Fe—B alloy having a composition $(Co_xFe_{100-x})_{100-z}B_z$ in which an amount x of Co was 50, 40, 30, 20, 10, and 0, and an amount z of B was 5, 10, 20, and 30 was shown in Table 4.

First, in the experiment 5, samples (1) to (24) were used. The samples 1 to 24 are samples corresponding to the memory element 3 having a structure shown in FIG. 2A.

In addition, the samples (1) to (23) correspond to the memory element 3 of this embodiment and the sample (24) corresponds to a comparative example.

TABLE 4

|  | $(Co_{50}-Fe_{50})_{100-z}-B_z$ | $(Co_{40}-Fe_{60})_{100-z}-B_z$ | $(C_{30}-Fe_{70})_{100-z}-B_z$ | $(Co_{20}-Fe_{80})_{100-z}-B_z$ | $(Co_{10}-Fe_{90})_{100-z}-B_z$ | $Fe_{100-z}-B_z$ |
|---|---|---|---|---|---|---|
| $B_z$ = 5 atomic % | 19 | 40 | 42 | 42 | 43 | 44 |
| $B_z$ = 10 atomic % | 20 | 41.5 | 43 | 44 | 44 | 45 |
| $B_z$ = 20 atomic % | 20 | 43 | 44 | 45 | 46 | 46 |
| $B_z$ = 30 atomic % | 21 | 45 | 47 | 48 | 48 | 48 |

As can be seen from Table 4, the thermal stability Δ in all compositions except that a case where the amount x of Co was 50, and the amount z of B was 5 to 30 was maintained to be large.

That is, as is the case with the result of the experiment 4, it was revealed that the amount x of Co of 50 and 60 became a boundary line for securing high thermal stability in a extremely minute element corresponding to the spin injection type memory of the Gbit class.

Therefore, from the above-described result, it was revealed that the Co—Fe—B alloy of the memory layer 17 was suitable for manufacturing the spin injection type memory of the Gbit class in the following composition:

$(Co_x-Fe_y)_{100-z}-B_z$,

Here, $0 \le Cox \le 40$, $60 \le Fe_y \le 100$, $0 < B_z \le 30$.

In addition, in regard to the Co—Fe—B alloy, in a composition where the ratio of Fe was great in Co and Fe, the difference between the $M_{effective}$ and Ms becomes large, and this alloy is apt to be magnetized, and therefore it is easy to secure thermal stability.

Therefore, in a case where the capacity of the magnetic memory increases and the size of the memory element 3 decreases, it is easy to secure thermal stability in the Co—Fe—B alloy containing a large amount of Fe.

Therefore, for example, in consideration of a situation in which the spin injection type magnetic memory of the Gbit class is realized by the memory layer 17 in which the amount y of Fe is 60, and the size thereof is 70 nmϕ, it is preferable that whenever the diameter of the memory element 3 decreases by 5 nmϕ, the amount y of Fe in the Co—Fe—B alloy increase by a value of 5.

For example, in the case of the $(Co_x-Fe_y)_{100-z}-B_z$, the amount y of Fe is set in a manner that an atomic % as a content in CoFe is 65%, 70%, 75%, 80%, . . . (in terms of the amount x of Co, 35%, 30%, 25%, 20%, . . . ), and this is a more appropriate example to correspond to the size reduction of the memory element.

Experiment 5

Next, in the following experiments 5 and 6, investigation is made into a configuration in which the upper and lower interfaces of the memory layer 17 comes into contact with oxide and a structure in which the memory layer 17 is formed of Co—Fe—B to which at least one of the non-magnetic metal and the oxide is added, instead of being formed of a single layer of Co—Fe—B.

Specific layered structures of the samples (1) to (24) are shown in FIGS. 6A to 6E.

Figure 6A:
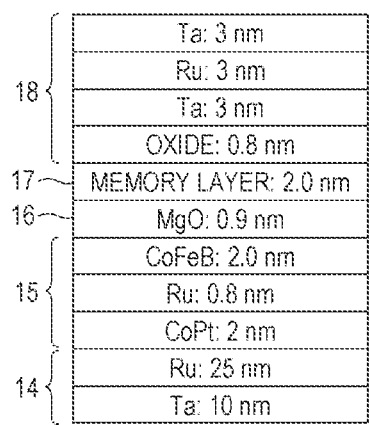
FIGS. 6A to 6E are explanatory views illustrating a layer structure of a layered structure of an experiment 5 according to the embodiment.

Similarly to the experiments 1 to 4, a thermal oxide film having a thickness of 300 nm was formed on a silicon substrate having a thickness of 0.725 mm, and the memory element 3 having a configuration shown in FIG. 6A was formed on the thermal oxide film.

As shown in FIG. 6A, layered structures of the samples (1) to (24) were set as follows.

Underlying layer 14: Laminated film of a Ta film having a film thickness of 10 nm and a Ru film having a film thickness of 25 nm Magnetization-fixed layer 15: Laminated film of a CoPt film having a film thickness of 2 nm, an Ru film having a film thickness 0.8 nm, and a CoFeB film having a film thickness of 2.0 nm Insulating layer 16: Magnesium oxide film having a film thickness of 0.9 nm Memory layer 17: Laminated film of a CoFeB film and at least one of non-magnetic metal and oxide that has various film thickness, in which a total film thickness is 2.0 nm Cap layer 18: Laminated film of oxide having a film thickness of 0.8 nm, a Ta film having a film thickness of 3 nm, a Ru film having a film thickness of 3 nm, and a Ta film having a thickness of 3 nm In regard to the samples (1) to (23), at least one side of Ti, V, Nb, Zr, Ta, Hf, and Y as the non-magnetic metal, and MgO, $SiO_2$, and Al—O as the oxide is added to the memory layer 17 including CoFeB as a main component.

Figure 6B:
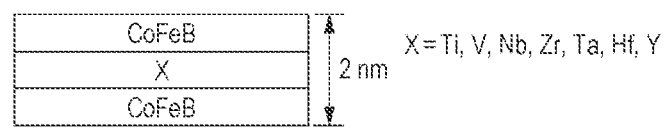

In regard to the samples (1) to (4), and (16) to (21), as shown in FIG. 6B, the memory layer 17 is configured to have a laminated structure of a CoFeB film, Ti, V, Nb, Zr, Ta, Hf, or Y film, and a CoFeB film. As shown in Table 5 as described below, each of the samples (1) to (4), in the total film thickness of 2.0 nm as the memory layer 17, a film thickness of the Ta film was set to 0.1 nm, 0.2 nm, 0.3 nm, and 0.4 nm, respectively. In addition, in regard to each of the samples (16) to (21), in the total film thickness of 2.0 nm as the memory layer 17, each film thickness of Ti, V, Nb, Zr, Hf, and Y films was set to 0.1 nm.

Figure 6C:
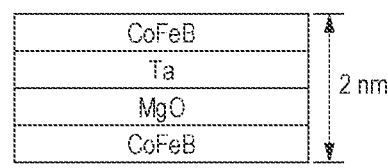

In regard to the samples (5) to (11), as shown in FIG. 6C, the memory layer 17 was configured to have a laminated structure of a CoFeB film, a Ta film, an MgO film, and a CoFeB film. In regard to each of the samples (5) to (11), in the total film thickness of 2.0 nm as the memory layer 17, a film thickness of the Ta film and the MgO film was changed.

In the sample (5), the MgO film: 0.1 nm, and the Ti Film: 0.1 nm.

In the sample (6), the MgO film: 0.15 nm, and the Ta Film: 0.15 nm.

In the sample (7), the MgO film: 0.1 nm, and the Ta Film: 0.2 nm.

In the sample (8), the MgO film: 0.2 nm, and the Ta Film: 0.1 nm.

In the sample (9), the MgO film: 0.2 nm, and the Ta Film: 0.2 nm.

In the sample (10), the MgO film: 0.25 nm, and the Ta Film: 0.15 nm.

In the sample (11), the MgO film: 0.15 nm, and the Ta Film: 0.25 nm.

Figure 6D:
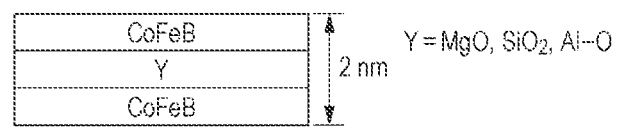

In regard to the samples (12) to (15), and (22) and (23), as shown in FIG. 6D, the memory layer 17 was configured to have a laminated structure of an MgO, $SiO_2$, or Al—O film, and a CoFeB film. As shown in Table 5 described later, in regard to each of the samples (12) to (15), in the total film thickness of 2.0 nm as the memory layer 17, a film thickness of the MgO film was set to 0.1 nm, 0.2 nm, 0.3 nm, and 0.4 nm, respectively. In addition, in regard to each of the samples (22) and (23), in the total film thickness of 2.0 nm as the memory layer 17, each film thickness of the $SiO_2$ and Al—O films was set to 0.1 nm.

Each of the samples was set to the above-described structure, and a Cu film (not shown) having a film thickness of 100 nm (serving as a word line described below) was provided between the underlying layer 14 and the silicon substrate.

Each layer other than the insulating layer 16 formed of a magnesium oxide film was formed using a DC magnetron sputtering method.

The insulating layer 16 formed of the magnesium oxide (MgO) film was formed using a RF magnetron sputtering method.

The magnetization-fixed layer 15 is laminated ferri-coupled, and a coupling strength thereof was substantially 5 kOe.

In addition, after forming each layer of the memory element 3, a heating treatment was performed in a magnetic field heat treatment furnace.

Next, after masking a word line portion by a photolithography, a selective etching by Ar plasma was performed with respect to a laminated film other than the word line portion, and thereby the word line (lower electrode) was formed. At this time, a portion other than the word line was etched to the depth of 5 nm in the substrate.

Then, a mask of a pattern of the memory element 3 by an electron beam drawing apparatus was formed, a selective etching was performed with respect to the laminated film, and thereby each sample as the memory element 3 was formed. A portion other than the memory element 3 was etched to a portion of the word line immediately over the Cu layer.

In addition, in the memory element for the characteristic evaluation, it is necessary to make a sufficient current flow to the memory element so as to generate a spin torque necessary for the magnetization inversion, such that it is necessary to suppress the resistance value of the tunnel insulating layer. Therefore, a pattern of the memory element 3 was set to a circular shape having a short axis of 0.05 μm×a long axis of 0.05 μm, and an area resistance value ($\Omega\mu m^2$) of the memory element 3 was set to 20 $\Omega\mu m^2$.

Next, a portion other than the memory element 3 was insulated by sputtering $Al_2O_3$ to have a thickness of substantially 100 nm. Then, a bit line serving as an upper electrode and a measurement pad were formed by using photolithography.

In this manner, a sample of the memory element 3 was manufactured.

A composition of the Co—Fe—B alloy of the magnetization-fixed layer 15 and the memory layer 17 was set to (Co30%-Fe70%)80%-B20% (atomic %).

Figure 6E:
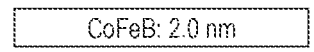
Figure 7:
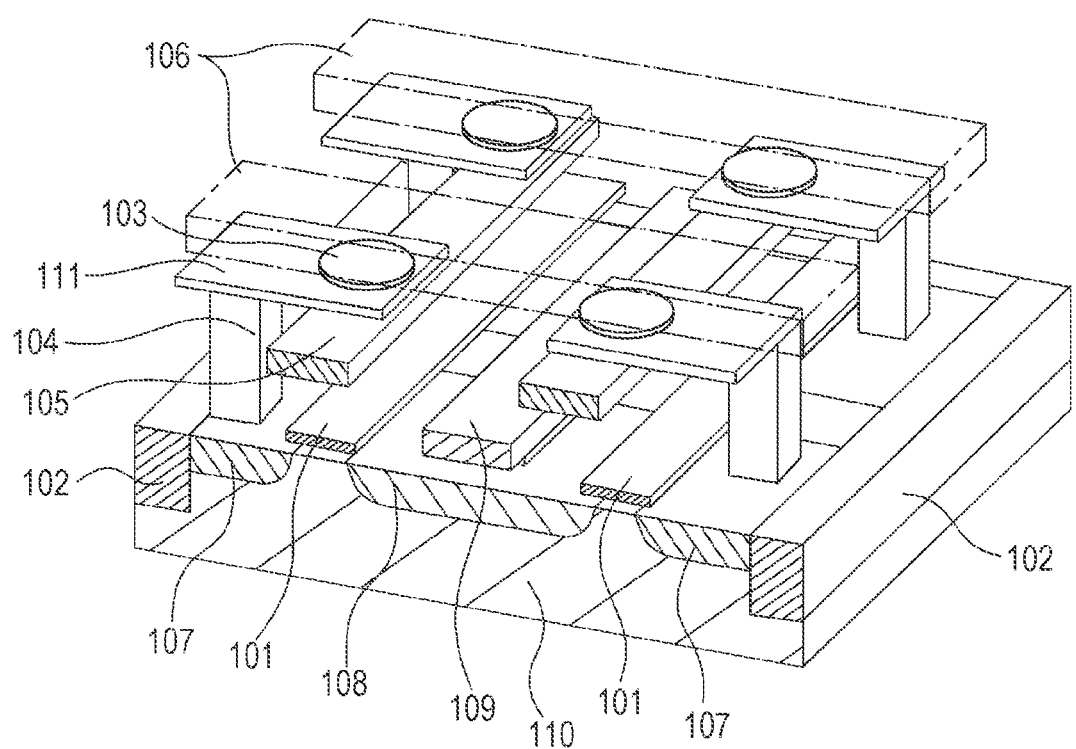
FIG. 7 is a perspective view schematically illustrating a configuration of an MRAM in the related art.
Figure 8:
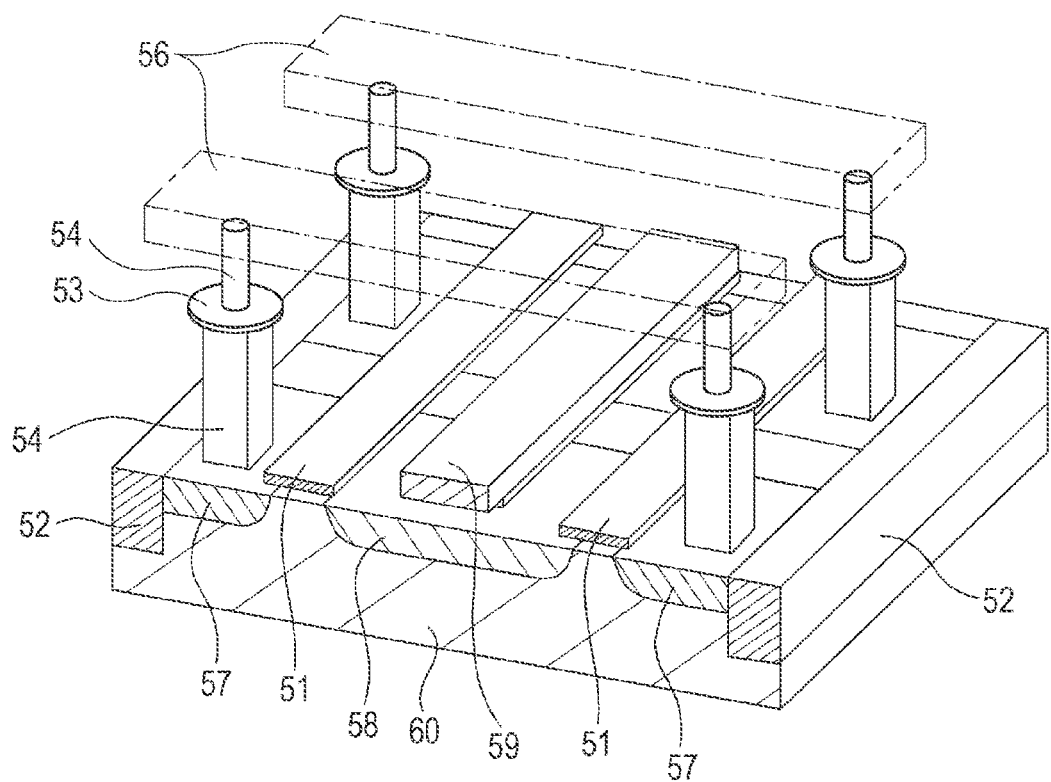
FIG. 8 is an explanatory view illustrating a configuration of a memory device using magnetic inversion by spin injection.
Figure 9:
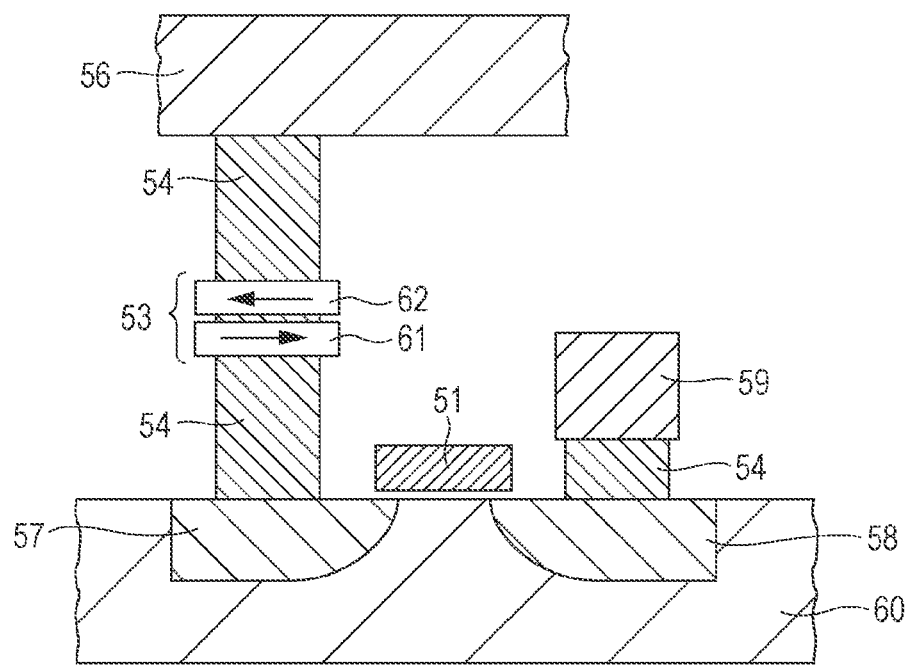
FIG. 9 is a cross-sectional view of a memory device in FIG. 8.

In addition, as a comparative example (24), as shown in FIG. 6E, the memory layer 17 was configured by a CoFeB single layer having a thickness of 2 nm.

Measurement of Magnetization Curve

A magnetization curve of each sample was measured by a VSM measurement using a Vibrating Sample Magnetometer. At this time, a bulk film portion of approximately 8 mm×8 mm specially designed for the magnetization curve evaluation was used in the measurement instead of an element after being subjected to a micromachining. In addition, a magnetic field for measurement was applied in a direction perpendicular to a film face.

Measurement of Thermal Stability

An inversion current value was measured for the purpose of evaluating the thermal stability of the memory element 3.

A current having a pulse width of 10 μs to 100 ms is made to flow to each sample, and then a resistance value of each sample was measured. The inclination of a pulse width dependency of the inversion current value corresponds to the above-described index Δ of the thermal stability of each sample. The less the inversion current value is changed (the inclination is small) by the pulse width, the more the memory element is strengthened against thermal disturbance.

In addition, twenty samples with the same configuration were manufactured, respectively, for each sample to take variation in the samples into consideration, the above-described measurement was performed, and an average value of the inversion current value and the index Δ of the thermal stability were obtained.

Coercive force of each of the samples (1) to (24) including the memory layer 17, which was obtained by VSM, is shown in Table 5.

TABLE 5

| Sample No | Additive | Amount of additive converted into a film thickness (nm) | Coercive force (Oe) | $KV/k_BT$ |
|---|---|---|---|---|
| (1) | Ta | 0.1 | 258 | 58 |
| (2) |  | 0.2 | 412 | 67 |
| (3) |  | 0.3 | 450 | 68 |
| (4) |  | 0.4 | 0 | — |
| (5) | MgO/Ta | 0.1/0.1 | 372 | 63 |
| (6) |  | 0.15/0.15 | 288 | 61 |
| (7) |  | 0.1/0.2 | 255 | 55 |
| (8) |  | 0.2/0.1 | 270 | 60 |
| (9) |  | 0.2/0.2 | 0 | — |
| (10) |  | 0.25/0.15 | 0 | — |
| (11) |  | 0.15/0.25 | 0 | — |
| (12) | MgO | 0.1 | 189 | 51 |
| (13) |  | 0.2 | 210 | 53 |
| (14) |  | 0.3 | 216 | 53 |
| (15) |  | 0.4 | 0 | — |
| (16) | Ti | 0.1 | 241 | 56 |
| (17) | V | 0.1 | 235 | 55 |
| (18) | Nb | 0.1 | 235 | 55 |
| (19) | Zr | 0.1 | 230 | 55 |
| (20) | Hf | 0.1 | 228 | 53 |
| (21) | Y | 0.1 | 220 | 54 |
| (22) | SiO2 | 0.1 | 183 | 50 |

TABLE 5-continued

| Sample No | Additive | Amount of additive converted into a film thickness (nm) | Coercive force (Oe) | KV/$k_B$T |
|---|---|---|---|---|
| (23) | Al—O | 0.1 | 195 | 51 |
| (24) | None | — | 150 | 43 |

As can be seen from Table 5, among the samples (1) to (4), and (16) to (21), in which the upper and lower sides of the memory layer 17 were formed of oxide (MgO), and non-magnetic metal was added to the memory layer 17, coercive force greater than that of the sample (24) of the comparative example, was obtained in the samples (1) to (3), and (16) to (21).

In addition, among the samples (5) to (11), in which the upper and lower sides of the memory layer 17 were formed of oxide (MgO), and oxide of MgO and non-magnetic metal were added to the memory layer 17, coercive force greater than that of the sample (24) of the comparative example was obtained in the samples (5) to (8).

In addition, among the samples (12) to (15), the sample (22), and the sample (23), in which the upper and lower sides of the memory layer 17 were formed of oxide (MgO), and oxide of MgO was added to the memory layer 17, coercive force greater than that of the sample (24) of the comparative example was obtained in the samples (12) to (14), the sample (22), and the sample (23).

That is, in the samples using the memory layer 17 to which at least one of the non-magnetic metal and the oxide was added, in a case where the oxide was present at the upper and lower sides of the memory layer 17, and a volume ratio of the additive was a predetermined value or less, the coercive force was obtained.

Here, from the comparison of the coercive force and KV/$k_B$T between the sample (24) using the memory layer 17 of the CoFeB single layer, and the samples (1) to (3), the samples (16) to (21), the samples (5) to (8), the samples (12) to (14), the sample (22), and the sample (23), which use the memory layer 17 to which at least one of the non-magnetic metal and oxide was added and the coercive force was obtained, it can be seen that in the case of satisfying the condition under which the coercive force is obtained, the memory element 3 using the memory layer 17 to which at least one of the non-magnetic metal and the oxide clearly has large coercive force and KV/$k_B$T.

From this, the configuration of the embodiment, that is, the memory element 3 using the memory layer 17 in which the oxide is present at upper and lower sides thereof, and at least one of the non-magnetic metal and the oxide is added thereto, is a suitable configuration for realizing high coercive force and KV/$k_B$T.

The reason why coercive force and KV/$k_B$T are improved when oxide is present at the upper and lower side of the memory layer 17 to which at least one of the non-magnetic metal and the oxide is added is considered to be because when the memory layer 17 comes into contact with the oxide, a chance for Co or Fe to couple with oxygen in MgO is increased, and therefore perpendicular magnetic anisotropy caused by an orbital hybridization is more enhanced.

The reason why coercive force in the memory layer 17 to which at least one of non-magnetic metal and oxide is added becomes larger than that in the memory layer 17 using a CoFeB single layer is guessed to be because in the case of the CoFeB single layer, perpendicular magnetic anisotropy caused by an orbital hybridization different at the upper and lower sides in a single magnetic layer is induced, such that when viewed as a whole, a force for enhancing perpendicular magnetic anisotropy is difficult to be utilized effectively.

Contrary to this, in the case of the memory layer 17 to which at least one of non-magnetic metal and oxide is added, since a material different from CoFeB is present in the memory layer 17, even as perpendicular magnetic anisotropy different at the upper and lower sides is induced, a difference in perpendicular magnetic anisotropy is alleviated by a different layer, and therefore a chance for Co or Fe to couple with oxygen in MgO is increased and perpendicular magnetic anisotropy is enhanced more effectively.

Experiment 6

Next, a sample having a dual MTJ structure in which magnetization-fixed layers 15U and 15L are provided at the upper and lower sides of the memory layer 17 similarly to the memory element 3 shown in FIG. 2B was manufactured by using a material of the memory layer 17 of the samples (1) to (3), the samples (5) to (8), and the samples (12) to (14) shown in Table 5.

As the upper magnetization-fixed layer 15U, a laminated film of CoFeB having a film thickness of 2 nm and TbFeCo layer having a film thickness of 15 nm was used.

In the two insulating layers 16U and 16L, a difference in a film thickness is present, and a total RA was adjusted to be 30 Ωμm².

A basis element manufacturing process is the same as the experiment 5.

Result of the same measurement as the experiment 5 is shown in Table 6. In addition, samples manufactured with a dual structure using the same memory layer structure as the samples (1) to (3), the samples (5) to (8), and the samples (12) to (14) are shown as samples (1') to (3'), samples (5') to (8'), and samples (12') to (14').

TABLE 6

| Sample No | Additive | Amount of additive converted into a film thickness (nm) | Coercive force (Oe) | KV/$k_B$T |
|---|---|---|---|---|
| (1') | Ta | 0.1 | 262 | 56 |
| (2') |  | 0.2 | 400 | 65 |
| (3') |  | 0.3 | 435 | 66 |
| (5') | MgO/Ta | 0.1/0.1 | 380 | 63 |
| (6') |  | 0.15/0.15 | 290 | 60 |
| (7') |  | 0.1/0.2 | 255 | 54 |
| (8') |  | 0.2/0.1 | 267 | 60 |
| (12') | MgO | 0.1 | 183 | 50 |
| (13') |  | 0.2 | 215 | 53 |
| (14') |  | 0.3 | 222 | 54 |

In the dual structure, in samples using the memory layer 17 to which at least one of non-magnetic metal and oxide is added, high coercive force and KV/$k_B$T were obtained.

Here, a matter of importance is that since perpendicular magnetic anisotropy largely depends on the memory layer 17 and a material adjacent to the memory layer 17, in the case of manufacturing a dual MTJ, as a material of the memory layer 17 interposed between two oxides, when a material in which coercive force becomes large when interposed between the two oxice is used, relatively excellent KV/$k_B$T are obtained.

From this viewpoint, a memory element 3, which uses a memory layer 17 having a configuration shown in Table 6, that is, a configuration in which oxide are provided at the upper and lower side thereof, and at least one of non-magnetic metal and oxide is added, has a suitable configuration for realizing enhanced perpendicular magnetic anisotropy, and high coercive force and $KV/k_BT$.

From the above-described experiments 5 and 6, it can be seen that when at least one side of Ti, V, Nb, Zr, Ta, Hf, and Y as the non-magnetic metal, and MgO, SiO$_2$, and Al—O as the oxide is added to Co—Fe—B magnetic layer making up the memory layer 17, and oxide is provided at the upper and lower sides of the memory layer 17, perpendicular magnetic anisotropy is enhanced, and coercive force and thermal stability $KV/k_BT$ are improved compared to a memory layer is configured by a Co—Fe—B magnetic layer alone.

In addition, this configuration may be applied to a dual MTJ in addition to a single MTJ.

Hereinbefore, the is described, but the present disclosure is not limited to the layer configuration of the memory element 3 illustrated in the above-described embodiment, and it is possible to adopt various layer configurations.

For example, in the embodiment, the Co—Fe—B composition of the memory layer 17 and the magnetization-fixed layer 15 was made to be the same as each other, but it is not limited to the above-described embodiment, and various configurations may be made without departing from the scope of the present disclosure.

In addition, the underlying layer 14 and the cap layer 18 may be formed of a single material, or may be formed by a laminated structure of a plurality of materials.

In addition, the magnetization-fixed layer 15 may be formed by a single layer or may use a laminated ferri-pin structure including two ferromagnetic layers and a non-magnetic layer. In addition, a structure in which anti-ferromagnetic film is applied to the laminated ferri-pin structure film is possible.

It should be understood that various changes and modifications to the presently preferred embodiments described herein will be apparent to those skilled in the art. Such changes and modifications can be made without departing from the spirit and scope and without diminishing its intended advantages. It is therefore intended that such changes and modifications be covered by the appended claims.

The invention claimed is:

1. A storage element comprising:
   a memory layer having a first magnetization state of a first material;
   a first fixed magnetization layer having a second magnetization state of a second material;
   a second fixed magnetization layer having a third magnetization state of a third material;
   a first intermediate layer and a second intermediate layer each including a nonmagnetic material;
   wherein the memory layer is provided between the first intermediate layer and the second intermediate layer,
   wherein the first intermediate layer is provided between the first fixed magnetization layer and the memory layer, and
   wherein the second intermediate layer is provided between the second fixed magnetization layer and the memory layer.

2. The storage element according to claim 1, wherein the first material includes a Co—Fe—B composition, and at least one of a non-magnetic metal and an oxide.

3. The storage element according to claim 2, wherein the non-magnetic metal
   includes at least one of Ti, V, Nb, Zr, Ta, Hf, and Y.

4. The storage element according to claim 2, wherein the oxide includes at least one of MgO, SiO$_2$, and aluminum oxide.

5. The storage element according to claim 1, wherein the first and second intermediate layers each include at least one of magnesium oxide, aluminum oxide, aluminum nitride, SiO2, Bi2O3, MgF2, CaF, SrTiO2, AlLaO3, and AlNO.

6. The storage element according to claim 1, wherein a thickness of the memory
   layer is from 0.5 nm to 30 nm.

7. The storage element according to claim 1, wherein the memory layer is configured to receive an effective diamagnetic field that is smaller than a saturated magnetization amount of the memory layer.

8. The storage element according to claim 1, wherein the first magnetization state of a first material includes a magnetization direction perpendicular to a film face.

9. The storage element according to claim 1, wherein a thickness of at least one of the first and second intermediate layers is 1.5 nm or less.

10. The storage element according to claim 1, wherein the first magnetization state of the first material is configured to be changed by a current.

11. A memory comprising:
    a storage element; and
    two types of lines that intersect with each other,
    wherein the storage element includes
    a memory layer having a first magnetization state of a first material;
    a first fixed magnetization layer having a second magnetization state of a second material;
    a second fixed magnetization layer having a third magnetization state of a third material;
    a first intermediate layer and a second intermediate layer each including a nonmagnetic material;
    wherein the memory layer is provided between the first intermediate layer and the second intermediate layer,
    wherein the first intermediate layer is provided between the first fixed magnetization layer and the memory layer, and
    wherein the second intermediate layer is provided between the second fixed magnetization layer and the memory layer.

12. The memory according to claim 11, wherein the first material includes a Co—Fe—B composition, and at least one of a non-magnetic metal and an oxide.

13. The memory according to claim 12, wherein the non-magnetic metal includes at
    least one of Ti, V, Nb, Zr, Ta, Hf, and Y.

14. The memory according to claim 12, wherein the oxide includes at least one of MgO, SiO$_2$, and aluminum oxide.

15. An electronic apparatus comprising:
    a magnetic storage element including:
       a memory layer having a first magnetization state of a first material;
       a first fixed magnetization layer having a second magnetization state of a second material;
       a second fixed magnetization layer having a third magnetization state of a third material;
       a first intermediate layer and a second intermediate layer each including a nonmagnetic material;
       wherein the memory layer is provided between the first intermediate layer and the second intermediate layer,
       wherein the first intermediate layer is provided between the first fixed magnetization layer and the memory layer, and
       wherein the second intermediate layer is provided between the second fixed magnetization layer and the memory layer.

16. The electronic apparatus according to claim 15, wherein the first material includes a Co—Fe—B composition, and at least one of a non-magnetic metal and an oxide.

17. The electronic apparatus according to claim 16, wherein the non-magnetic metal includes at least one of Ti, V, Nb, Zr, Ta, Hf, and Y.

18. The electronic apparatus according to claim 16, wherein a thickness of the memory layer is from 0.5 nm to 30 nm.

* * * * *